United States Patent
Huang et al.

(10) Patent No.: US 7,271,024 B2
(45) Date of Patent: Sep. 18, 2007

(54) METHOD FOR FABRICATING SENSOR SEMICONDUCTOR DEVICE

(75) Inventors: Chien-Ping Huang, Taichung (TW); Chih-Ming Huang, Taichung (TW); Cheng-Yi Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 11/163,310

(22) Filed: Oct. 13, 2005

(65) Prior Publication Data

US 2006/0270089 A1 Nov. 30, 2006

(30) Foreign Application Priority Data

May 25, 2005 (TW) ............................... 94117009 A

(51) Int. Cl.
*H01L 21/00* (2006.01)
*H01L 31/113* (2006.01)
(52) U.S. Cl. ............................. 438/51; 438/22; 438/48; 438/E21.62; 257/291; 257/292; 257/293
(58) Field of Classification Search ............ 438/22–25, 438/48, 57–59; 257/291–294, 222
See application file for complete search history.

(56) References Cited

U.S. PATENT DOCUMENTS

| | | | |
|---|---|---|---|
| 6,646,289 B1 | 11/2003 | Badehi | |
| 6,767,753 B2 * | 7/2004 | Huang | ........................ 438/25 |
| 2006/0267125 A1 * | 11/2006 | Huang et al. | ............... 257/433 |

* cited by examiner

*Primary Examiner*—Dung A. Le

(57) ABSTRACT

A sensor semiconductor device and a method for fabricating the same are proposed. A plurality of metal bumps and a sensor chip are mounted on a substrate. A dielectric layer and a circuit layer are formed on the substrate, wherein the circuit layer is electrically connected to the metal bumps and the sensor chip. Thus, the sensor chip is electrically connected to the substrate via the circuit layer and the metal bumps. The dielectric layer is formed with an opening for exposing a sensor region of the sensor chip. A light-penetrable lid covers the opening of the dielectric layer, such that light is able to penetrate the light-penetrable lid to reach the sensor region and activate the sensor chip. A plurality of solder balls are mounted on a surface of the substrate free of mounting the sensor chip, for electrically connecting the sensor chip to an external device.

8 Claims, 4 Drawing Sheets

US 7,271,024 B2

METHOD FOR FABRICATING SENSOR SEMICONDUCTOR DEVICE

FIELD OF THE INVENTION

The present invention relates to sensor semiconductor devices and methods for fabricating the same, and more particularly, to a chip-scale packaged (CSP) sensor semiconductor device, and a method for fabricating the sensor semiconductor device.

BACKGROUND OF THE INVENTION

In a conventional image sensor package, a sensor chip is mounted on a chip carrier and is electrically connected to the chip carrier via bonding wires, and a piece of glass is provided above the sensor chip to allow an image to be captured by the sensor chip. The image sensor package can be integrated to an external device such as a printed circuit board (PCB) to be used in various electronic products such as digital still camera (DSC), digital video camera (DVC), optical mouse, cellular phone, fingerprint scanner, and so on.

Along with expansion of data transmission capacity and development of miniaturized and portable electronic products, integrated circuit (IC) packages have been developed to have an advanced chip-scale packaged (CSP) structure in response to the requirements such as plenty input/output (I/O) connections, high heat dissipating efficiency and size miniaturization for integrated circuits. Therefore, a chip-scale packaged sensor semiconductor device is provided to effectively reduce a size of the conventional image sensor package, wherein the semiconductor device is merely slightly larger in size than a sensor chip incorporated therein and thus can be effectively applied to miniaturized electronic products.

FIG. 1 (PRIOR ART) shows a chip-scale packaged sensor semiconductor device disclosed by U.S. Pat. No. 6,646,289. As shown in FIG. 1 (PRIOR ART), during fabrication of a wafer comprising sensor chips 11, a piece of glass 12 is applied over an active surface of the wafer to protect sensor regions 18 of the sensor chips 11, and an epoxy layer 13 and a protective layer 14 are applied over a non-active surface of the wafer. An etching process is performed on the non-active surface of the wafer to form a plurality of inclined slots 15, such that electrode pads 110 of the sensor chips 111 are exposed, and patterned circuit layers 16 are formed on side walls of the inclined slots 15 and extended to a bottom surface of the protective layer 14, allowing the circuit layers 16 to be electrically connected to the electrode pads 110 of the sensor chips 11. A plurality of solder balls 17 can subsequently be implanted on the circuit layers 16 at the bottom surface of the protective layer 14, and a singulation process is performed to form individual chip-scale packaged sensor semiconductor devices, such that the sensor semiconductor devices can directly be electrically connected to an external device by the solder balls 17.

However, in the foregoing sensor semiconductor device, since the circuit layers formed on the side walls of the inclined slots have an acute angle relative to the electrode pads of the sensor chip electrically connected to the circuit layers, such acute-angle connection positions between the circuit layers and the electrode pads may easily be subject to stress concentration, thereby causing problems such as circuit cracking, failure in electrical connection, and so on. As fabrication of the foregoing sensor semiconductor device is directly performed on the wafer, which requires complicated fabrication processes and does not effectively solve a known good die (KGD) problem, making the fabrication costs greatly increased.

Therefore, the problem to be solved herein is to provide a chip-scale sensor semiconductor device and a method for fabricating the same, whereby the sensor semiconductor device can be cost-effectively fabricated and a circuit-cracking problem is avoided.

SUMMARY OF THE INVENTION

In light of the above drawbacks in the conventional technology, an objective of the present invention is to provide a cost-effective sensor semiconductor device and a method for fabricating the same.

Another objective of the present invention is to provide a sensor semiconductor device and a method for fabricating the same, which can prevent circuit cracking.

A further objective of the present invention is to provide a chip-scale sensor semiconductor device and a method for fabricating the same.

In accordance with the foregoing and other objectives, the present invention proposes a method for fabricating a sensor semiconductor device, comprising the steps of: mounting a plurality of metal bumps and at least one sensor chip on a substrate, wherein an active surface of the sensor chip is formed with a sensor region and a plurality of electrode pads, and a non-active surface of the sensor chip is attached to the substrate; applying a dielectric layer on the substrate, the metal bumps and the sensor chip, wherein the dielectric layer is formed with a plurality of first openings corresponding in position to the metal bumps and the electrode pads of the sensor chip; forming a circuit layer on the dielectric layer, wherein the circuit layer is electrically connected to the metal bumps and the electrode pads of the sensor chip; forming a second opening in the dielectric layer at a position corresponding to the sensor region of the senor chip; and providing a light-penetrable lid to cover the second opening of the dielectric layer corresponding to the sensor region of the sensor chip, and implanting a plurality of solder balls on a surface of the substrate not for mounting the sensor chip. If the fabrication method is performed in a batch-type manner, a singulation process is further required to form a plurality of individual sensor semiconductor devices.

The present invention also proposes a sensor semiconductor device, comprising: a substrate having a first surface and a corresponding second surface; a plurality of metal bumps mounted on the first surface of the substrate; a sensor chip mounted on the first surface of the substrate, wherein an active surface of the sensor chip is formed with a sensor region and a plurality of electrode pads, and a non-active surface of the sensor chip is attached to the substrate; a dielectric layer applied on the substrate, the metal bumps and the sensor chip, wherein the dielectric layer is formed with a plurality of first openings corresponding in position to the metal bumps and the electrode pads of the sensor chip and a second opening corresponding in position to the sensor region of the sensor chip; a circuit layer formed on the dielectric layer, and electrically connected to the metal bumps and the electrode pads of the sensor chip; a light-penetrable lid mounted on the circuit layer, for covering the second opening of the dielectric layer corresponding to the sensor region of the sensor chip; and a plurality of solder balls implanted on the second surface of the substrate.

By the sensor semiconductor device and the method for fabricating the same in the present invention, metal bumps and a sensor chip are firstly mounted on a substrate, and then a dielectric layer and a circuit layer are formed on the substrate by a build-up process. The circuit layer is electrically connected to the metal bumps and the sensor chip, such that the sensor chip can be electrically connected to the substrate via the circuit layer and the metal bumps. The dielectric layer is formed with an opening for exposing a sensor region of the sensor chip. A light-penetrable lid is provided to cover the opening of the dielectric layer, such that light is able to penetrate the light-penetrable lid to reach the sensor region and activate the sensor chip. A plurality of solder balls are implanted on a surface of the substrate not for mounting the sensor chip, so as to allow the sensor chip to be electrically connected to an external device by the solder balls. In the present invention, the sensor chip can be subjected to a test and any defective chip failing in the test is eliminated in advance, such that the reliability of subsequent fabricating processes is improved and a known good die (KGD) problem is avoided. By the arrangement that the sensor chip is electrically connected to the substrate via the circuit layer and the metal bumps and is subsequently electrically connected to the external device via the solder balls, the sensor semiconductor device can be fabricated in a cost-effective manner as compared to the conventional technology, and a chip-cracking problem is prevented in the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a sensor semiconductor device and a method for fabricating the same proposed in the present invention are described below with reference to FIGS. 2A-2F and FIG. 3. It should be noted that the drawings are simplified schematic diagrams for illustrating the basic design of the present invention and thus only show relevant elements to the present invention. The drawings are not made with the actual amount, shape and size of the elements. In practice, the number, shape and size of the elements can be flexibly modified, and an element layout may be more complex.

FIGS. 2A to 2F are cross-sectional views of steps of a method for fabricating a sensor semiconductor device according to the present invention. In this embodiment, a batch-type method is employed to fabricate the sensor semiconductor device. It should be understood that the sensor semiconductor device in the present invention can also be fabricated in a singular-type manner under suitable fabrication conditions.

Figure 1:
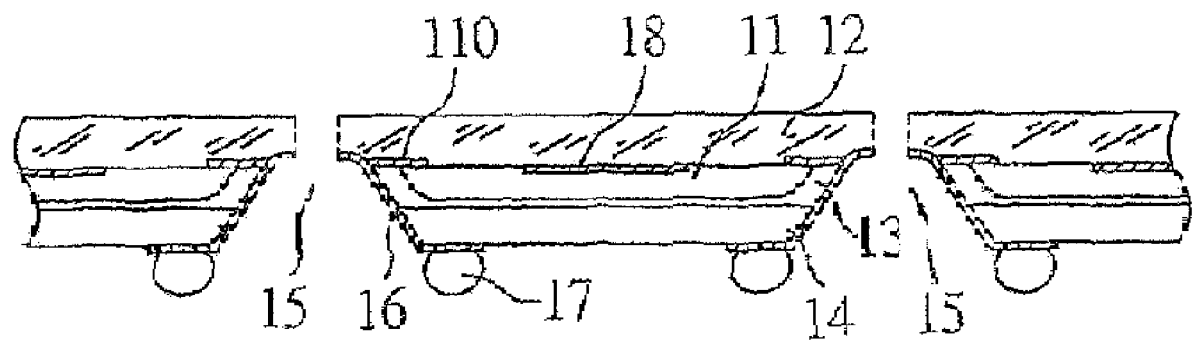
FIG. 1 (PRIOR ART) is a cross-sectional view of a chip-scale packaged sensor semiconductor device as disclosed in U.S. Pat. No. 6,646,289.
Figure 2A:
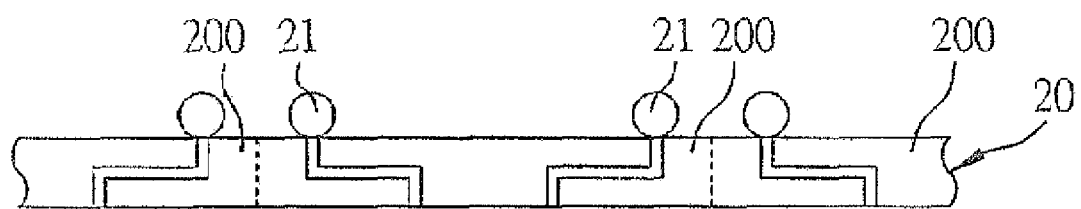
FIGS. 2A to 2F are cross-sectional views of steps of a method for fabricating a sensor semiconductor device according to the present invention.

Referring to FIG. 2A, a substrate module plate 20 comprising a plurality of substrates 200 is provided, wherein a plurality of metal bumps 21 are mounted on and electrically connected to each of the substrates 200. The substrate module plate 20 can be a matrix-type or strip-type substrate module plate. The metal bumps 21 can be gold bumps or solder bumps.

Figure 2B:
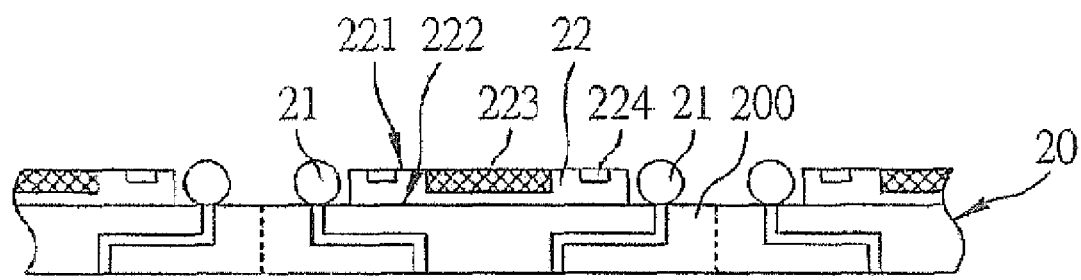

Referring to FIG. 2B, at least one sensor chip 22 is mounted on each of the substrates 200. The sensor chip 22 has an active surface 221 and a corresponding non-active surface 222, wherein the active surface 221 of the sensor chip 22 is formed with a sensor region 223 and a plurality of electrode pads 224, and the non-active surface 222 of the sensor chip 22 is attached to each of the substrates 200.

Figure 2C:
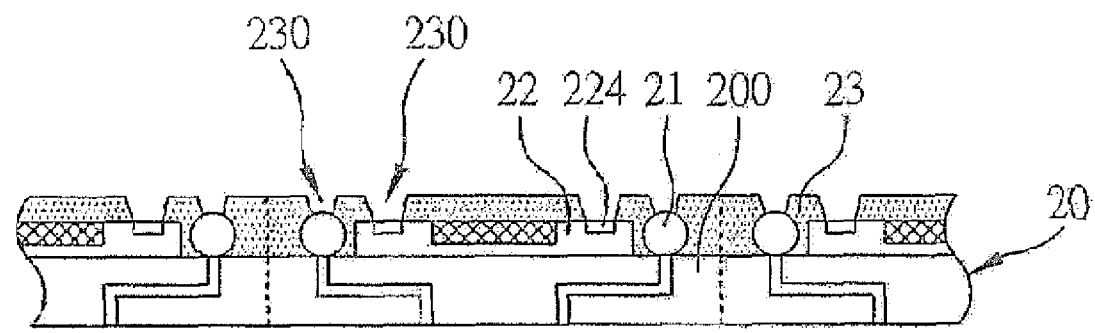

Referring to FIG. 2C, a dielectric layer 23 is formed on the substrate module plate 20 to cover the substrates 200, the metal bumps 21 and the sensor chips 22. A plurality of openings 230 are formed in the dielectric layer 23 at positions corresponding to the metal bumps 21 and the electrode pads 224 of the sensor chips 22.

Figure 2D:
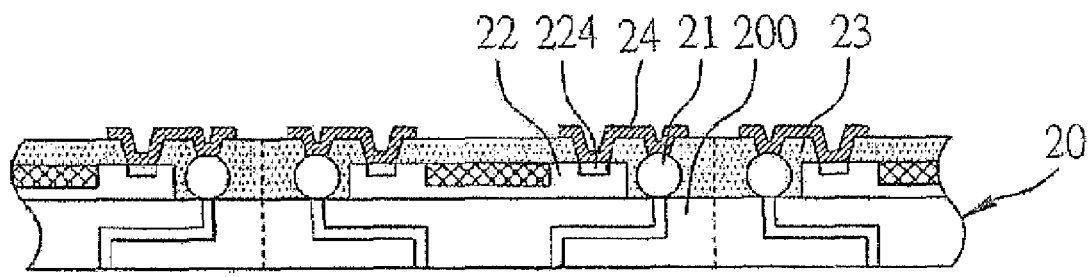

Referring to FIG. 2D, a circuit layer 24 is formed on the dielectric layer 23 and is electrically connected to the metal bumps 21 and the electrode pads 224 of the sensor chips 22.

Figure 2E:
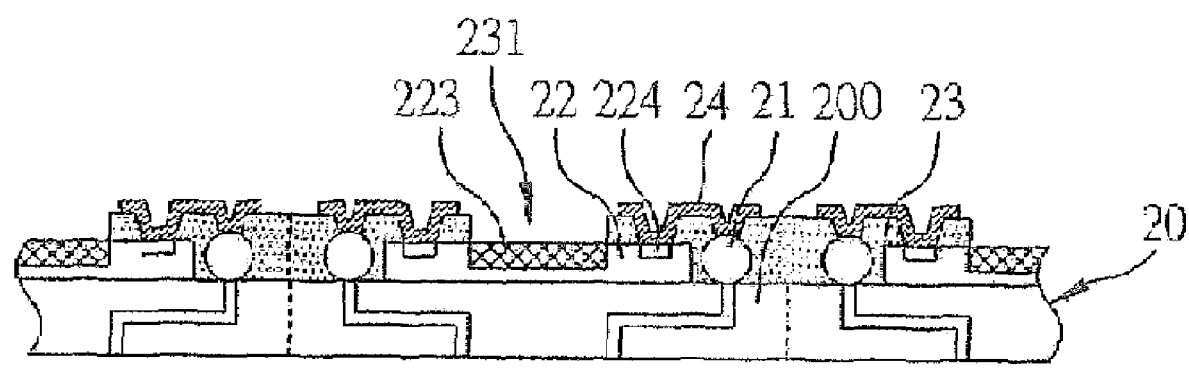

Referring to FIG. 2E, an opening 231 is further formed in the dielectric layer 23 at a position corresponding to the sensor region 223 of the sensor chip 22 on each of the substrates 200, such that the sensor regions 223 of the sensor chips 22 on the substrates 200 are exposed.

Figure 2F:
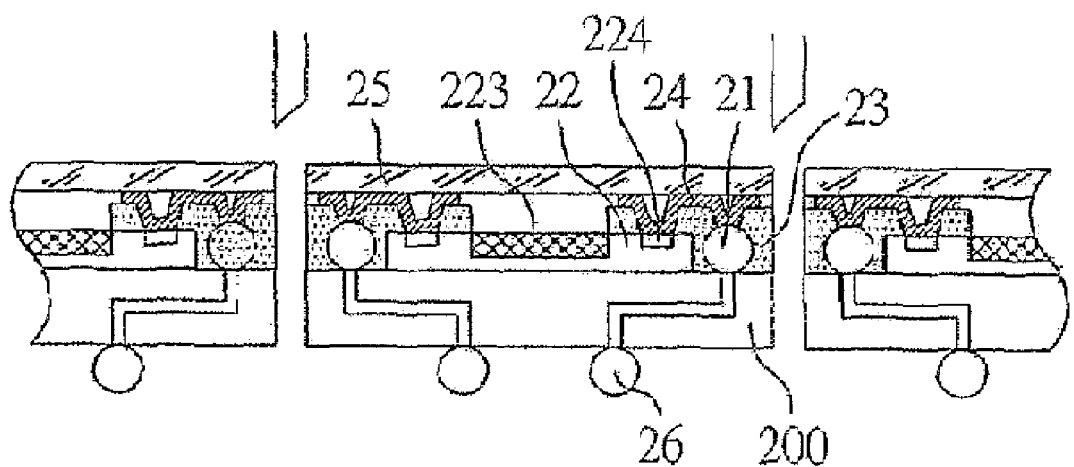

Referring to FIG. 2F, a light-penetrable lid 25 is mounted on the circuit layer 24 to cover the sensor regions 223 of the sensor chips 22, and a plurality of solder balls 26 are implanted on a surface of each of the substrates 200 not for mounting the sensor chip 22. A singulation process is performed to form a plurality of sensor semiconductor devices. The light-penetrable lid 25 can be made of glass or transparent paste. Therefore, the sensor chip can be electrically connected to an external device via the electrode pads, the circuit layer, the metal bumps, internal conductive structures of the substrate, and the solder balls.

By the foregoing fabrication method, the present invention also provides a sensor semiconductor device, comprising: a substrate 200 having a first surface and a corresponding second surface; metal bumps 21 mounted on the first surface of the substrate 200; a sensor chip 22 mounted on the first surface of the substrate 200, wherein an active surface 221 of the sensor chip 22 is formed with a sensor region 223 and a plurality of electrode pads 224, and a non-active surface 222 of the sensor chip 22 is attached to the substrate 200; a dielectric layer 23 applied on the substrate 200, the metal bumps 21 and the sensor chip 22, wherein the dielectric layer 23 is formed with a plurality of openings 230 corresponding in position to the metal bumps 21 and the electrode pads 224 of the sensor chip 22 and an opening 231 corresponding in position to the sensor region 223 of the sensor chip 22; a circuit layer 24 formed on the dielectric layer 23, and electrically connected to the metal bumps 21 and the electrode pads 224 of the sensor chip 22; and a light-penetrable lid 25 mounted on the circuit layer 24 to cover the sensor region 223 of the sensor chip 22. The sensor semiconductor device further comprises a plurality of solder balls 26 implanted on the second surface of the substrate 200.

By the sensor semiconductor device and the method for fabricating the same in the present invention, metal bumps and a sensor chip are firstly mounted on a substrate, and then a dielectric layer and a circuit layer are formed on the substrate by a build-up process. The circuit layer is electrically connected to the metal bumps and the sensor chip, such that the sensor chip can be electrically connected to the substrate via the circuit layer and the metal bumps. The dielectric layer is formed with an opening for exposing a sensor region of the sensor chip. A light-penetrable lid is provided to cover the opening of the dielectric layer, such that light is able to penetrate the light-penetrable lid to reach the sensor region and activate the sensor chip. A plurality of solder balls are implanted on a surface of the substrate not for mounting the sensor chip, so as to allow the sensor chip to be electrically connected to an external device by the solder balls. In the present invention, the sensor chip can be subjected to a test and any defective chip failing in the test is eliminated in advance, such that the reliability of subsequent fabricating processes is improved and a known good die (KGD) problem is avoided. By the arrangement that the sensor chip is electrically connected to the substrate via the circuit layer and the metal bumps and is subsequently electrically connected to the external device via the solder balls, the sensor semiconductor device can be fabricated in a cost-effective manner as compared to the conventional technology, and a chip-cracking problem is prevented in the present invention.

Figure 3:
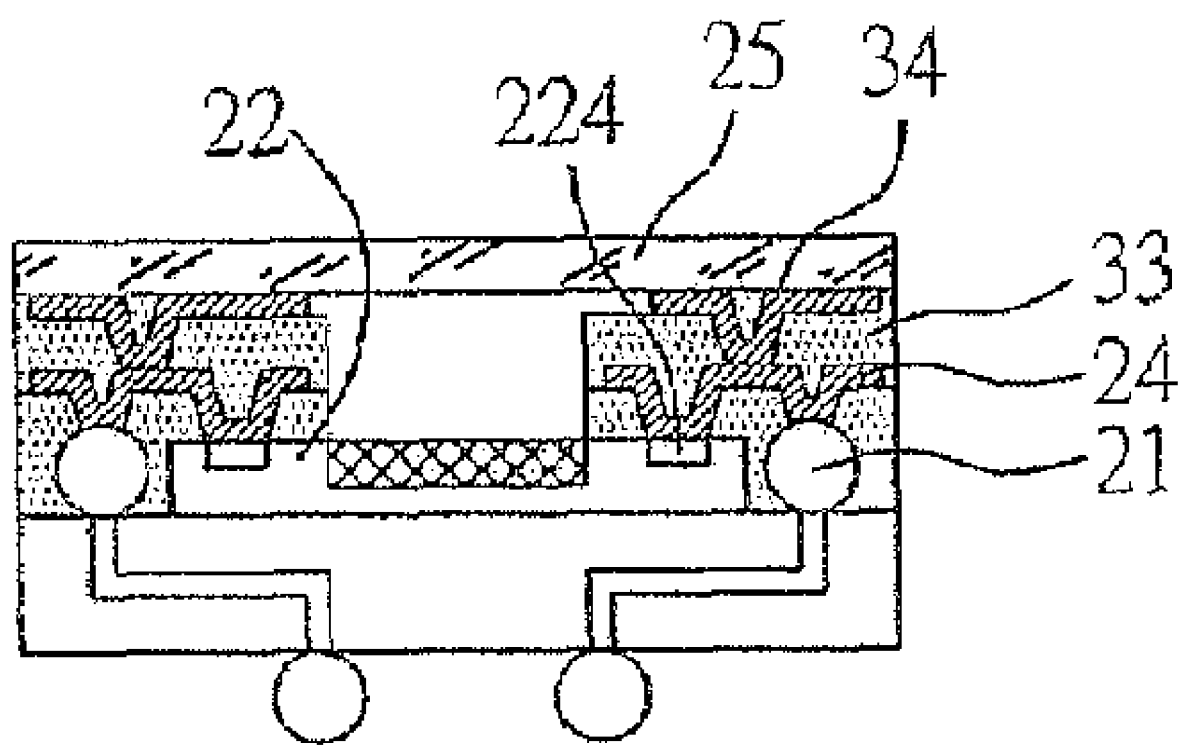
FIG. 3 is a cross-sectional view of a sensor semiconductor device according to another preferred embodiment of the present invention.

FIG. 3 is a cross-sectional view of a sensor semiconductor device according to another preferred embodiment of the present invention.

The sensor semiconductor device shown in FIG. 3 is fabricated by a method similar to that of the foregoing embodiment, with a primary difference in that a circuit build-up process is performed on the circuit layer 24 that is electrically connected to the metal bumps 21 and the electrode pads 224 of the sensor chip 22 as shown in FIG. 3. Firstly, a dielectric layer 33 is pressed on the circuit layer 24, wherein the dielectric layer 33 is formed with openings to partly expose the circuit layer 24. Then, a circuit layer 34 is formed on the dielectric layer 33 and is electrically connected to the circuit layer 24 underneath the dielectric layer 33. Therefore, electrical performances of the sensor semiconductor device can be improved by the circuit build-up structure. It should be noted that the number of build-up circuit layers is not limited to that shown in the drawing and can be increased according to practical requirements of electrical design.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a sensor semiconductor device, comprising the steps of:
    mounting a plurality of metal bumps and at least one sensor chip on at least one substrate, the sensor chip having an active surface and a corresponding non-active surface, wherein the active surface of the sensor chip is formed with a sensor region and a plurality of electrode pads, and the non-active surface of the sensor chip is attached to the substrate;
    applying a dielectric layer on the substrate, the metal bumps and the sensor chip, wherein the dielectric layer is formed with a plurality of first openings corresponding in position to the metal bumps and the electrode pads of the sensor chip;
    forming a circuit layer on the dielectric layer, wherein the circuit layer is electrically connected to the metal bumps and the electrode pads of the sensor chip;
    forming a second opening in the dielectric layer at a position corresponding to the sensor region of the sensor chip; and
    providing a light-penetrable lid to cover the second opening of the dielectric layer corresponding to the sensor region of the sensor chip.

2. The method of claim 1, further comprising a step of implanting a plurality of solder balls on a surface of the substrate free of mounting the sensor chip.

3. The method of claim 1, further comprising a step of performing a circuit build-up process on the circuit layer that is electrically connected to the metal bumps and the electrode pads of the sensor chip.

4. The method of claim 1, wherein the at least one substrate comprises at least one single substrate, a matrix of substrates, or a strip of substrates.

5. The method of claim 1, wherein the light-penetrable lid is mounted on the circuit layer to cover the second opening of the dielectric layer.

6. The method of claim 1, wherein the sensor semiconductor device is a chip-scale packaged sensor semiconductor device.

7. The method of claim 1, wherein the metal bumps are gold bumps or solder bumps.

8. The method of claim 1, wherein the light-penetrable lid made of glass or transparent paste.

* * * * *